United States Patent
Cleveland et al.

(10) Patent No.: US 8,654,912 B2
(45) Date of Patent: Feb. 18, 2014

(54) MIMO TRANSMITTER WITH POOLED ADAPTIVE DIGITAL FILTERING

(75) Inventors: Joseph R. Cleveland, Murphy, TX (US); Eran Pisek, Plano, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 2177 days.

(21) Appl. No.: 11/545,437

(22) Filed: Oct. 10, 2006

(65) Prior Publication Data

US 2007/0258544 A1 Nov. 8, 2007

Related U.S. Application Data

(60) Provisional application No. 60/798,166, filed on May 5, 2006.

(51) Int. Cl.
*H04B 1/10* (2006.01)
(52) U.S. Cl.
USPC .......................................................... 375/350
(58) Field of Classification Search
USPC ......................................... 375/350, 295, 296
See application file for complete search history.

(56) References Cited

U.S. PATENT DOCUMENTS

| | | | | |
|---|---|---|---|---|
| 7,034,612 | B2* | 4/2006 | Kim | 330/149 |
| 7,110,727 | B2* | 9/2006 | Dekker | 455/91 |
| 7,203,511 | B2* | 4/2007 | Trachewsky et al. | 455/522 |
| 2006/0133531 | A1* | 6/2006 | Iwasaki | 375/267 |
| 2006/0281422 | A1* | 12/2006 | Pan et al. | 455/127.1 |

* cited by examiner

*Primary Examiner* — Jaison Joseph

(57) ABSTRACT

MIMO transmitter with a reconfigurable pooled digital filter is disclosed. A processor uses the output of an envelope detector to set parameters of the filter to minimize the number of instructions per second and the amount of power required by the filter to perform. The processor uses an algorithm or a lookup table stored in memory to select the combination of filter parameters. The parameters may be selected from at least one of: a number of taps, a filter length, a word length, a coefficient quantization, a sampling rate, bits per sample, a sampling bit, a tap delay and a coefficient length. After selecting a combination of filter parameters, the processor sends a control signal to the adaptive filter. The pooled adaptive filter reconfigures itself in accordance with the selected filter parameters.

24 Claims, 6 Drawing Sheets

MIMO TRANSMITTER WITH POOLED ADAPTIVE DIGITAL FILTERING

CROSS-REFERENCE TO RELATED APPLICATION AND CLAIM OF PRIORITY

The present application is related to U.S. Provisional Patent No. 60/798,166, filed May 5, 2006, entitled "MIMO TRANSMITTER WITH POOLED ADAPTIVE DIGITAL FILTERING THAT REDUCES SIGNAL PROCESSING". U.S. Provisional Patent No. 60/798,166 is assigned to the assignee of the present application and is hereby incorporated by reference into the present disclosure as if fully set forth herein. The present application hereby claims priority under 35 U.S.C. §119(e) to U.S. Provisional Patent No. 60/798,166.

TECHNICAL FIELD OF THE INVENTION

The present application relates generally to wireless communication networks and, more specifically, to multi-input, multiple output (MIMO) transmitter systems.

BACKGROUND OF THE INVENTION

Modern communications demand higher data rates and performance. Multi-input, multiple output (MIMO) antenna systems, also known as multiple-element antenna (MEA) systems, achieve greater spectral efficiency for allocated RF channel bandwidths. MIMO systems increase the spectral efficiency by utilizing space or antenna diversity at both the transmitter and the receiver.

Transmitters typically include fixed pulse-shaping filters such as, for example, raised root cosine (RRC) or finite impulse response (FIR) filters. Such filters are designed to meet the emission mask at the maximum output power and operate with the same sampling rate, word length and number of taps regardless of the amount of out-of-band suppression required for that power level. Thus, these filters operate at the maximum processing power at all times. Such systems consume more power than necessary to maintain a proper emission profile and to maintain reliable communications on the RF link to the receiver.

There is therefore a need for efficient transmitter filters for use in MIMO systems. More particularly, there is a need for reconfigurable digital filters for MIMO transmitters that reduce processing power and power dissipation for multiple MIMO streams.

SUMMARY OF THE INVENTION

The present disclosure provides a technique for pooled adaptive digital filtering to reduce signal processing requirements.

In one embodiment, a method for providing adaptive digital filtering for use in a wireless transmitter is disclosed. The method includes detecting a first power level of a first signal and a second power level of a second signal on a symbol-by-symbol basis. The method also includes selecting a combination of filter parameter values according to the first power level and the second power level. The method further includes filtering the first signal and the second signal according to the combination of filter parameters.

In another embodiment, a multi-input, multi-output (MIMO) transmitter filter for use in a wireless communication system is disclosed. The filter includes a module to detect a first power level of a first signal and a second power level of a second signal on a symbol-by-symbol basis. The filter also includes a processor to select a combination of filter parameter values according to the first power level and the second power level. The filter further includes a reconfigurable filter pool to filter the first signal and the second signal according to the combination of filter parameters.

In still another embodiment, a transmitter for use in a multi-input, multi-output (MIMO) system is disclosed. The transmitter includes a waveform detector to detect a first power level of a first transmitted MIMO stream and a second power level of a second transmitted MIMO stream on a symbol-by-symbol basis. The transmitter also includes a processor to select a combination of filter parameter values according to the first power level and the second power level. The transmitter further includes a reconfigurable filter pool to filter the first transmitted MIMO stream and the second transmitted MIMO stream according to the combination of filter parameters.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless network.

Figure 1:
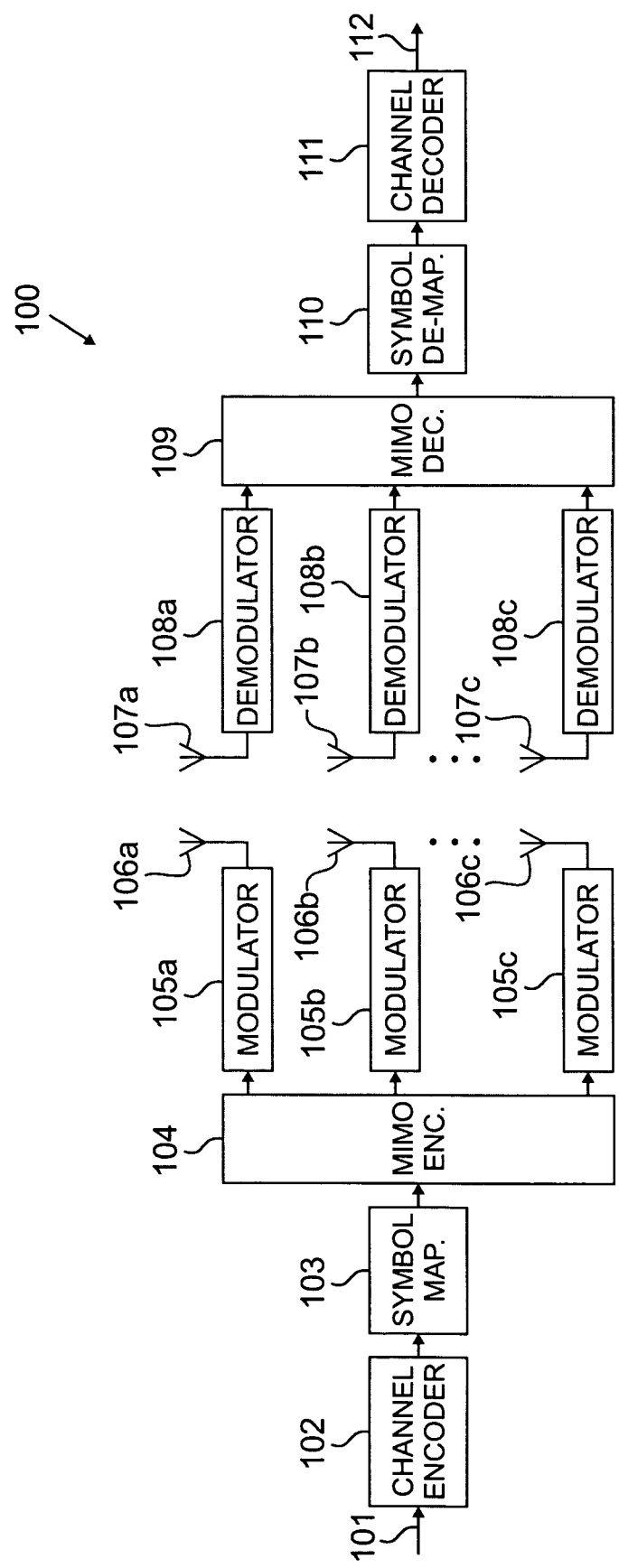
FIG. 1 illustrates a multi-input, multiple output (MIMO) system.

FIG. 1 illustrates a multi-input, multiple output (MIMO) system 100 in accordance with one embodiment of the present disclosure. Input data stream 101 from a single user is encoded by channel encoder 102. After passing the encoded signal through symbol mapping module 103, the signal is passed to MIMO encoder 104. MIMO encoder 104 applies a MIMO coding algorithm such as BLAST, space-time block code, space-time trellis code, space-time frequency code, space-time transmit diversity or other suitable MIMO coding algorithms known in the art. MIMO encoder 104 also demultiplexes the signal into $n_T$ separate sub-streams based on the procedure defined in the MIMO coding algorithm. Each of the $n_T$ substreams are fed into one of modulators 105a, 105b and 105c (collectively referred to herein as modulator 105). Each of the $n_T$ substreams are transmitted out of one of transmit antennas 106a, 106b and 106c (collectively referred to herein as transmit antenna 106), where each transmit antenna is associated with a respective modulator 105.

Each sub-stream transmitted by transmit antenna or transmitter 106 is received by one of $n_R$ receive antennas 107a, 107b and 107c (collectively referred to herein as receive antenna 107). Each receive antenna or receiver 107 is coupled to one of demodulator 108a, 108b and 108c (collectively referred to herein as demodulator 108). Each sub-stream is decoded in MIMO decoder 109 then encoded into channel symbols in symbol de-mapping module 110 and channel decoder 111. The same data rate may be implemented on each transmit antenna 106. Different adaptive modulation rates, however, may be utilized on each of the sub-streams ($n_T$).

With this transmission scheme, MIMO system 100 exhibits an increase in spectral efficiency. MIMO system 100 includes a rich scattering environment where the signals from each individual transmitter 106 appear highly uncorrelated at each receiver 107. The signals corresponding to each of the individual transmitter 106 attain different spatial signatures at each of the $n_R$ receivers 107 when the signals are conveyed through uncorrelated channels between transmitter 106 and receiver 107. Receiver 107 may use different spatial signatures to simultaneously separate the signals that originate from different transmitter 106 at the same frequency. Transmitter 106 may include a pulse-shaping filter (not shown) to generally: (1) limit the transmitted bandwidth so that the transmitted signal meets an emission mask; and (2) enable a receiver to recover the correct sample values of transmitted symbols. The pulse-shaping filter may be any suitable filter such as, for example, a raised root cosine (RRC) or finite impulse response (FIR) filter.

The digital filter used in the transmitter 106 of system 100 may have multiple taps. For wide-band code division multiple access (WCDMA) signals, the digital filter may be a 20-tap filter with a 16-bit input for each of I and Q (16-bit complex) and have a sampling rate twice the chip rate (e.g., 7.68 Msps). This configuration requires approximately 3600 MIPS for the 384 kbps Universal Mobile Telecommunications Service (UMTS) channel. The amount of processing required is based on the product of the number of taps (filter length), the word length (bits per sample), and coefficient length. Higher symbol rates require proportionately greater processing power and thereby more power consumption and heat generation.

Figure 2:
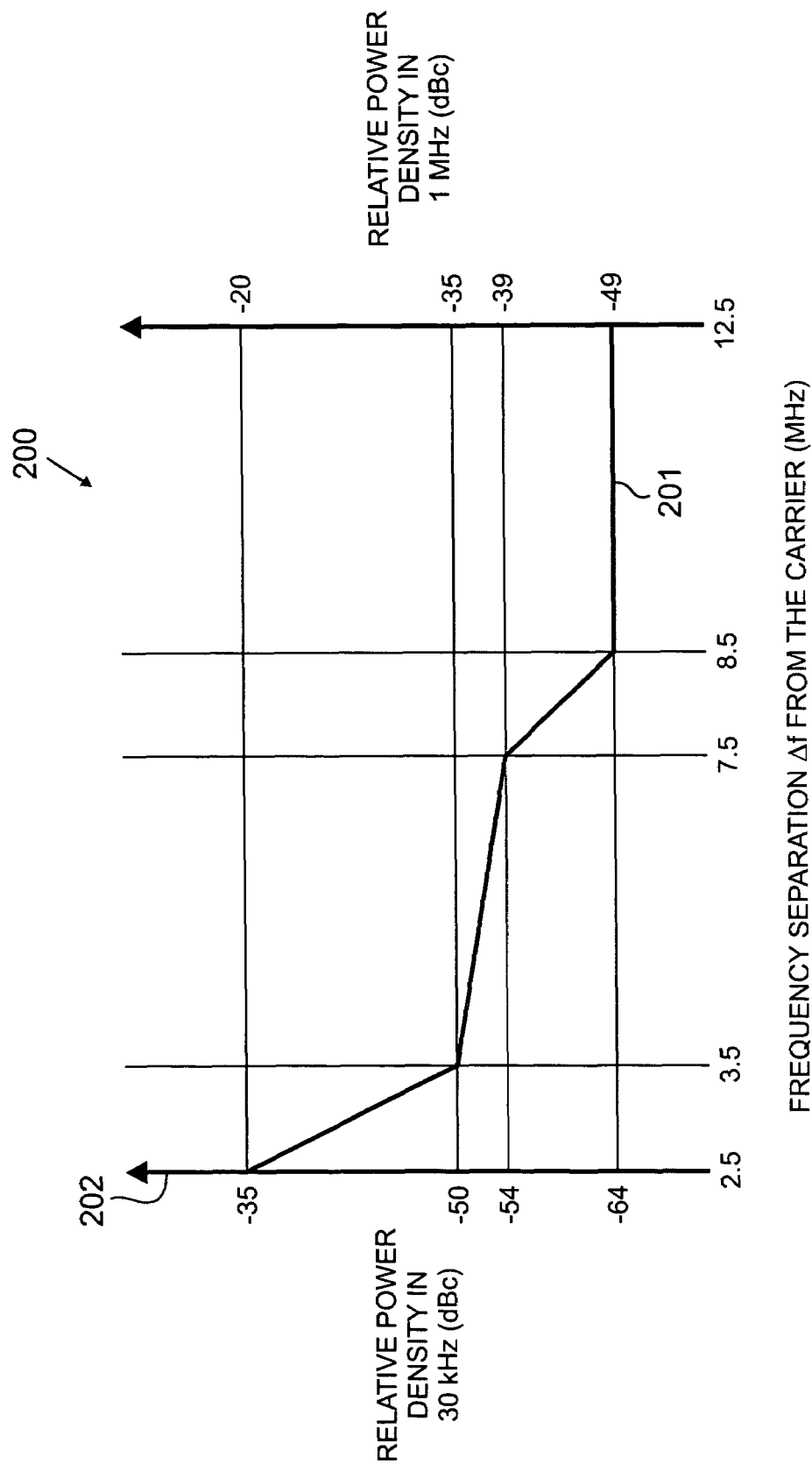
FIG. 2 illustrates a spectrum emission mask for a mobile terminal in a 5 MHz channel.

FIG. 2 illustrates spectrum emission mask 200 required by, for example, UMTS for a mobile terminal or mobile station (MS) in a 5 MHz channel for WCDMA or high-speed downlink packet access (HSDPA) signals. Emission mask 200 identifies the maximum allowed power of spurious and noise signals in the spectrum outside the authorized transmission channel. For example, emission mask 200 illustrates that as the relative change in frequency separation from the carrier 201 (the x-axis) increases, the relative power density 202 (the y-axes) decreases.

Figure 3:
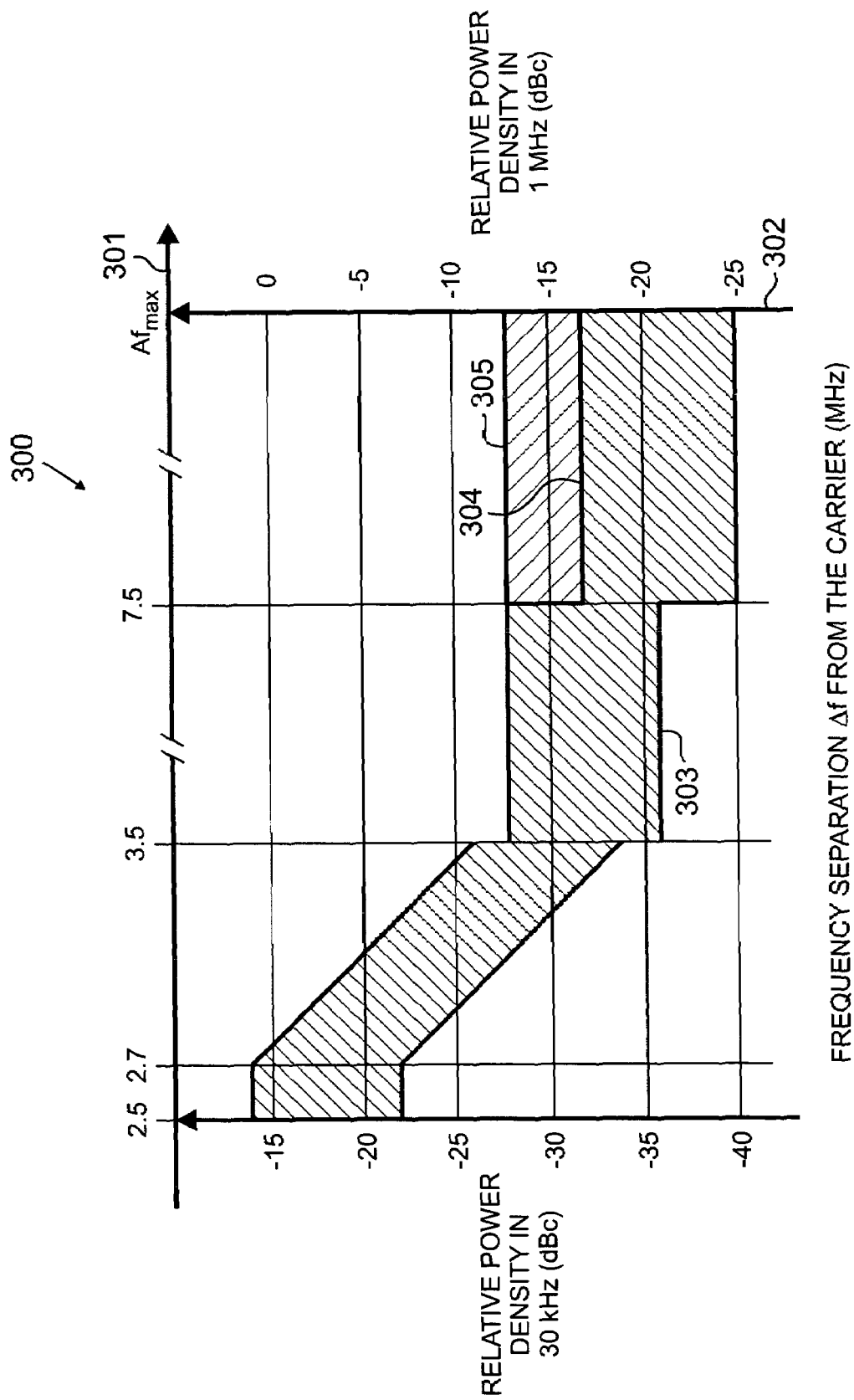
FIG. 3 illustrates a spectrum emission mask for a base transceiver system in a 5 MHz channel.

FIG. 3 illustrates spectrum emission mask 300 required by, for example, UMTS for a base transceiver system (BTS) in a 5 MHz channel for signals in, for example, WCDMA or HSDPA. Spectrum emission mask 300 illustrates that as the relative change in frequency separation from the carrier 301 (the x-axis) increases, the relative power density 302 (the y-axis) decreases. In addition, emission mask 300 identifies the maximum allowed power of spurious and noise signals in the spectrum outside the authorized transmission channel. The different transmit power levels 303, 304 and 305 highlighted in FIG. 3 correspond to different BTS classes or types.

Base stations and mobile stations adapt the transmit power to maintain a set signal-to-noise ratio (SNR) level at the respective receivers to mitigate any near-far problems. As a result, the nominal power level for base stations and mobile stations is often well below the designated maximum power levels referenced in FIGS. 2 and 3. Furthermore, for signals with a low crest factor in a modulation symbol burst, such as for CDMA, WCDMA or OFDM waveforms, the power level of the burst is well below the designated maximum power levels referenced in FIGS. 2 and 3. Hence, the filtering requirements for out-of-band emissions can be relaxed and the output emissions still meet the required mask.

Figure 4:
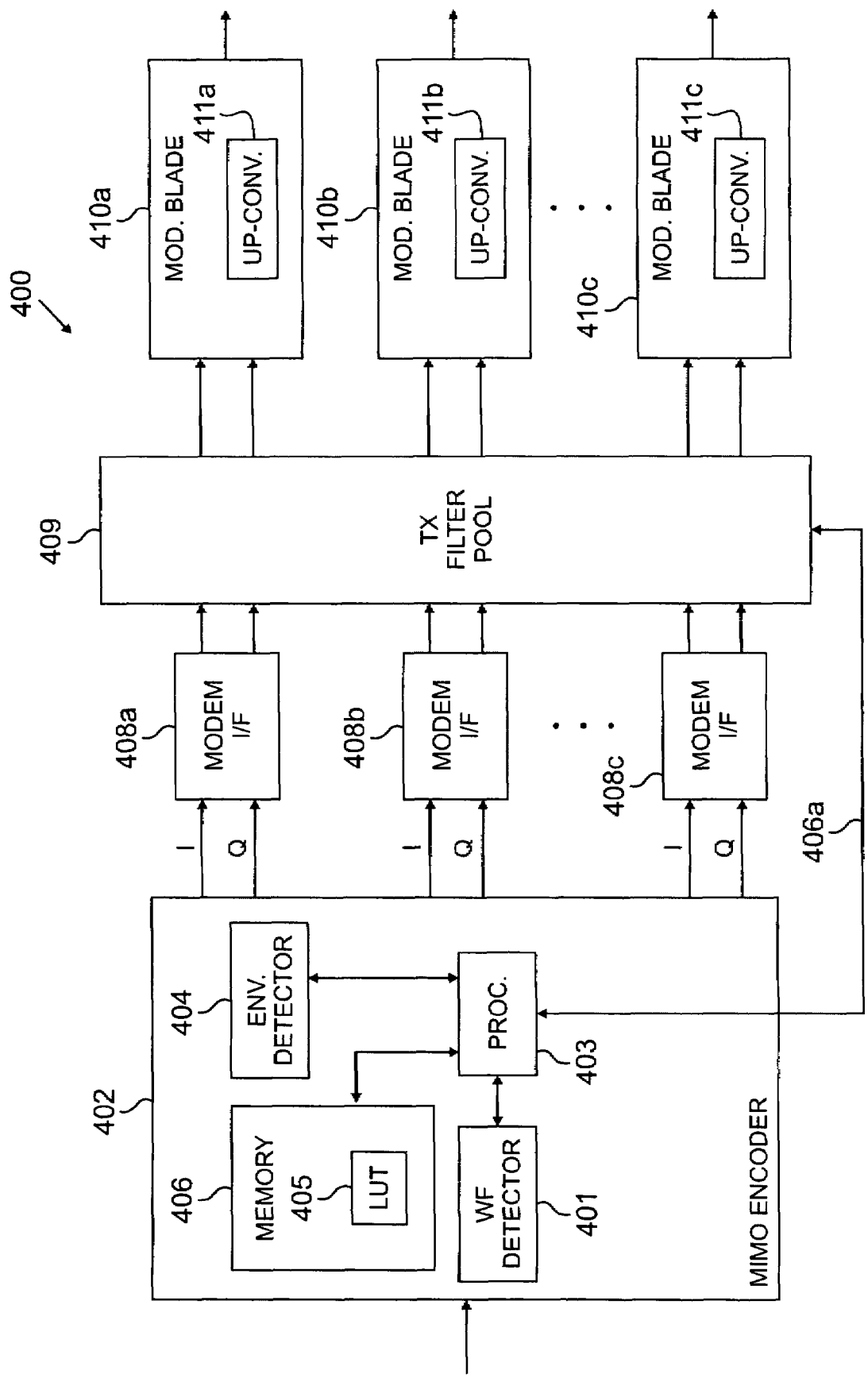
FIG. 4 illustrates the reconfigurable architecture of pooled digital filter for a wireless MIMO transmitter according to one embodiment of the present disclosure.

FIG. 4 illustrates the reconfigurable architecture of pooled digital filter 400 for use in a wireless MIMO transmitter according to one embodiment of the present disclosure. Digital filter 400 reduces processing power and power dissipation for multiple transmitter MIMO streams of modulation symbols. Digital filter 400 may be used in any suitable wireless network such as, for example, systems employing CDMA, WCDMA, OFDM, OFDMA technologies, or the like.

According to one embodiment of the present disclosure, digital filter 400 adaptively adjusts filter parameters (i.e., number of taps or filter length, word length, coefficient quantization, sampling rate, tap delay, sampling bits, etc.) based on signal waveform characteristics. The adaptive adjustments limit the transmitted bandwidth and allow transmitted signals to meet an emission mask, while still enabling a receiver to recover the correct sample values of transmitted symbols. Digital filter 400 may include any suitable programmable architecture.

Waveform detector 401 detects the power level of the transmitted signal on modulation symbol-by-symbol basis. Waveform detector 401 may be embedded in the modem, MIMO encoder 402 or may be implemented as a separate, external function in a field programmable gate array (FPGA) or application-specific integrated circuit (ASIC). Waveform detector 401 may be any suitable detector in accordance with the present disclosure.

Processor 403 uses the output of envelope detector 404 to set parameters of filter 400 to minimize the number of instructions per second and the amount of power required by filter 400 to perform. Processor 403 may be any suitable processor or part of any suitable reconfigurable processor. Processor 403 uses an algorithm or a lookup table 405 stored in memory 406 to select the combination of filter parameters (such as the number of taps (filter length), the word length (bits per sample), tap delay and coefficient length). In one embodiment according to the present disclosure, the filter parameters are chosen to minimize the number of instructions per second.

Processor 403 may use any suitable algorithm to select the combination of filter parameters in accordance with the present disclosure. In addition, the chosen parameter values should keep the power level consistent with minimizing the inter-symbol interference (ISI) for the waveform being transmitted. Processor 403 may select any combination of filter parameters to achieve a desired efficiency or as is required. For example, processor 403 may set the delay parameters and the tap coefficients and accordingly sends a processor control signal 406a to transmitter filter pool 409.

After the signal has been encoded in MIMO encoder 402, the outgoing I and Q data streams for each stream are passed to its respective modem interface (I/F) blades 408a, 408b and 408c (collectively referred to herein as modem blade 408). Although I and Q data streams for only three substreams are shown in FIG. 4, any suitable number of substreams may be used. After being processing in modem interface (I/F) 408, the signals are passed to transmitter (TX) filter pool 409.

Transmitter filter pool 409 processes the MIMO streams according to the received processor control signal 406a. Specifically, transmitter filter pool 409 adaptively adjusts the filter parameters based on the signal waveform characteristics previously ascertained and accounted for by processor 403. After passing through transmitter filter pool 409, the data streams are recombined and modulated in respective modulation blades 410a, 410b and 410c (collectively referred to herein as modulation blade 410) by respective up-conversion blocks 411a, 411b and 411c (collectively referred to herein as converter 411). The filtered signal is then passed along to a pulse amplitude modulation (PAM) module (not shown).

In one embodiment, the size of digital filter 400 provides enough processing for the average filter requirements known in art plus a predefined margin. Thus, filter 400 preferably meets all requirements for MIMO streams within a set percentage of the time. In one embodiment, the complexity of the MIMO system may be reduced by recognizing that each modulation stream has different coding, thus the crest factor of each transmitted modulation symbol will be distinct from that of the others.

Figure 5:
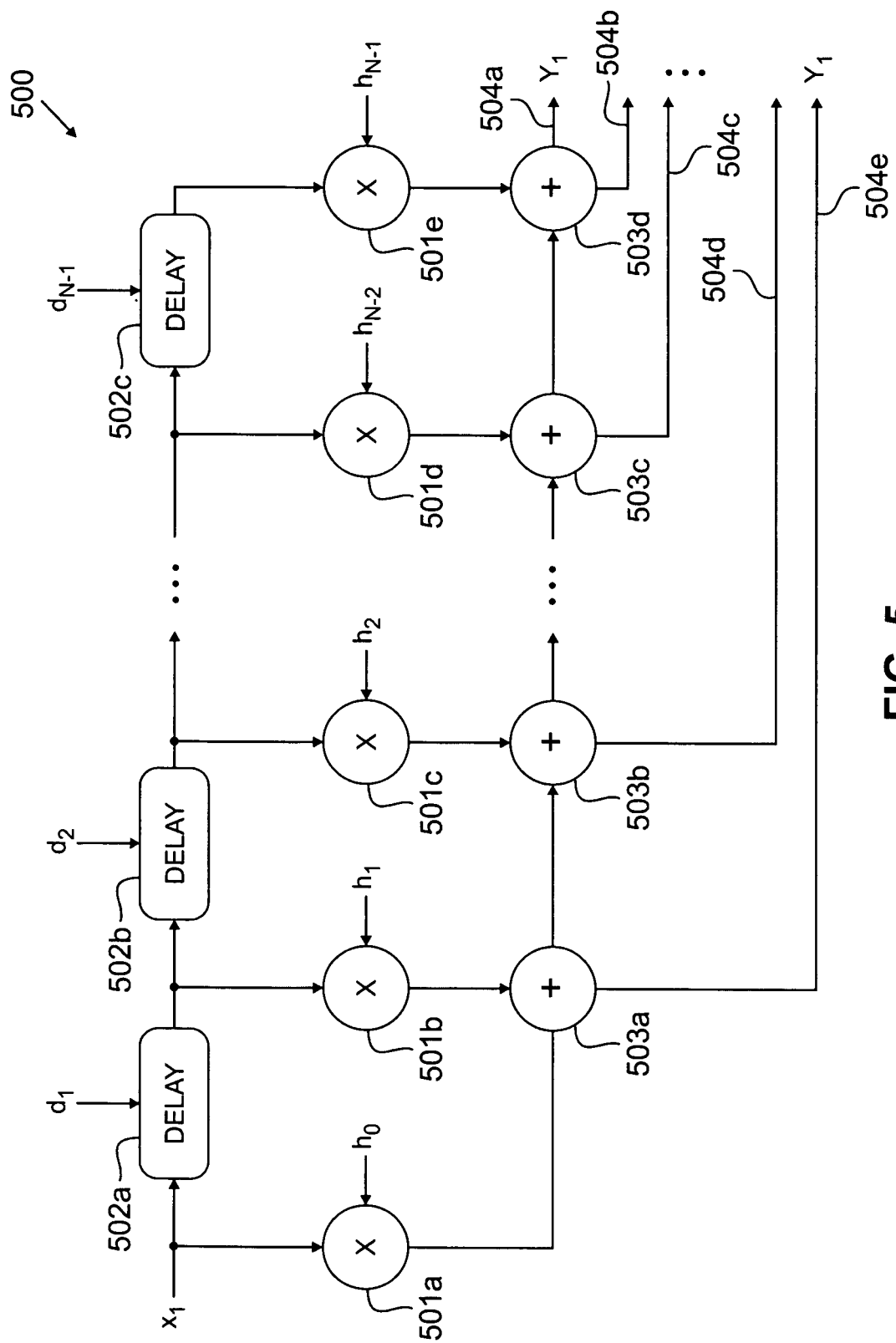
FIG. 5 illustrates a FIR filter in accordance with one embodiment of the present disclosure.

FIG. 5 illustrates FIR filter 500 in accordance with one embodiment of the present disclosure. FIR filter 500 includes tap coefficient set $\{h_0, h_1, \ldots, h_{N-1}\}$ 501a, 501b, 501c, 501d and 501e (collectively referred to herein as tap coefficient set 501). Although only five tap coefficient sets 501 are shown in FIG. 5, any suitable number of tap coefficient sets 501 may be used in accordance with the present disclosure. FIR filter 500 also includes a delay set $\{d_1, \ldots, d_{N-1}\}$ 502a, 502b and 502c (collectively referred to herein as delay set 502). Although only three delay sets 502 are shown in FIG. 5, any suitable number of delay sets may be used in accordance with the present disclosure. FIR filter 500 further includes tap output set $\{y_1, \ldots, y_{N-1}\}$ 503a and 503b (collectively referred to herein as tap output set 503). Although four tap output sets 503 are shown in FIG. 5, any suitable number of tap output sets 503 may be used. As described earlier, processor 403 sets the delay parameters and the tap coefficients and accordingly produces a processor control signal 406a accordingly. In one embodiment, the number of taps used is determined by the selection of the respective output port 504a, 504b, 504c, 504d and 504e (collectively referred to herein as output port 504) from tap output set $\{Y\}$ 503. Although four output ports 504 are shown in FIG. 5, any suitable number of output ports may be used.

Figure 6:
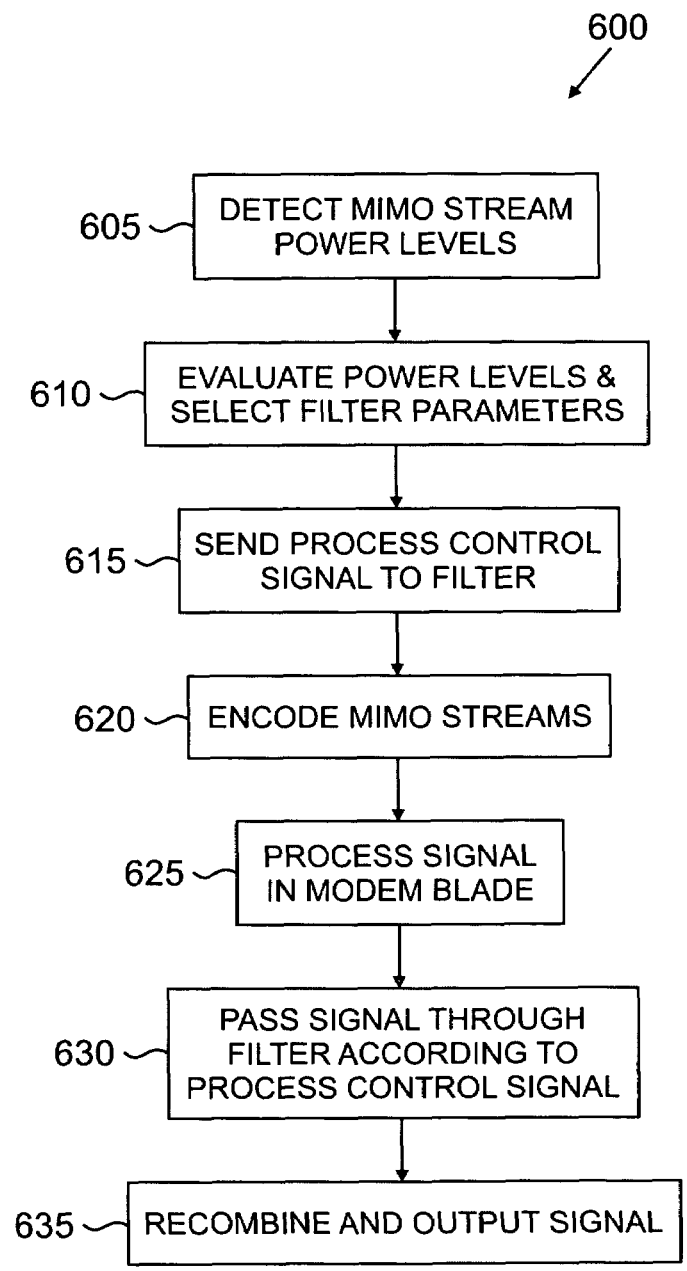
FIG. 6 is a somewhat simplified flow chart illustrating a method for filtering the transmitter of a MIMO system in accordance with one embodiment of the present disclosure.

FIG. 6 is a somewhat simplified flow chart illustrating method 600 for pooled-filtering of signals in a MIMO transmitter. In step 605, a waveform detector, such as waveform detector 401, detects the respective power levels of one or more transmitted MIMO streams on a symbol-by-symbol basis.

In step 610, a processor, such as processor 403, evaluates the respective power levels and MIMO streams. Processor 403 generates a process control signal, such as process control signal 406a. Process control signal 406a selects the various process control or filter parameters according to predetermined criteria such as, for example, inter-symbol interference, power consumption of the reconfigurable filter pool and the number of instructions performed by the reconfigurable filter pool. The predetermined criteria may be referenced from a lookup table, such as look up table 405 stored in memory 406. The predetermined criteria may be met by selecting a combination of parameters such as, for example, a number of taps, a filter length, a word length, a coefficient quantization, a sampling rate, bits per sample, a sampling bit, a tap delay and a coefficient length. In step 615, processor 403 sends a process control signal 406a to a reconfigurable filter pool, such as transmitter filter pool 409.

After processor 403 generates a process control signal 406a, the MIMO signals are encoded in an encoder, such as MIMO encoder 402, in step 620. The encoded signal is passed on to a modem interface (I/F) 408 and the signal is then processed in a modem blade, such as modem blade 408, in step 625. In step 630, the signal is passed to transmitter filter pool 409, where the signal is filtered according to process control signal 406a from processor 403. The data streams are recombined and modulated in a modulation blade, such as modulation blade 408 and finally ready for output to a PAM module in step 635.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a wireless transmitter, a method for providing adaptive digital filtering, comprising:
   detecting a first power level of a first signal and a second power level of a second signal on a symbol-by-symbol basis;
   selecting a combination of filter parameter values according to the first power level and the second power level; and
   filtering the first signal and the second signal according to the combination of filter parameters.

2. The method of claim 1, wherein selecting the combination of filter parameter values minimizes inter-symbol interference.

3. The method of claim 1, wherein selecting the combination of filter parameter values minimizes power consumption of a filter.

4. The method of claim 1, wherein selecting the combination of filter parameter values minimizes the number of instructions performed by a filter.

5. The method of claim 1, wherein selecting the combination of filter parameter values is accomplished using a lookup table.

6. The method of claim 1, wherein the filter parameter values are at least one of: a number of taps, a filter length, a word length, a coefficient quantization, a sampling rate, bits per sample, a sampling bit, a tap delay, a tap coefficient and a coefficient length.

7. The method of claim 1, wherein the filtering the first signal and the second signal achieves a desired efficiency.

8. The method of claim 1, wherein the filtering is accomplished by a reconfigurable filter pool.

9. The method of claim 8, wherein the reconfigurable filter pool comprises a reconfigurable digital signal processor.

10. The method of claim 1, wherein the transmitter is a multi-input, multi-output (MIMO) transmitter.

11. For use in a wireless communication system, a multi-input, multi-output (MIMO) transmitter filter comprising:
a module to detect a first power level of a first signal and a second power level of a second signal on a symbol-by-symbol basis;
a processor to select a combination of filter parameter values according to the first power level and the second power level; and
a reconfigurable filter pool to filter the first signal and the second signal according to the combination of filter parameters.

12. The filter of claim 11, wherein the combination of filter parameter values minimizes inter-symbol interference.

13. The filter of claim 11, wherein the combination of filter parameter values minimizes power consumption of the reconfigurable filter pool.

14. The filter of claim 11, wherein the combination of filter parameter values minimizes the number of instructions performed by the reconfigurable filter pool.

15. The filter of claim 11, wherein the processor selects the combination of filter parameter values using a lookup table.

16. The filter of claim 11, wherein the filter parameter values are at least one of: a number of taps, a filter length, a word length, a coefficient quantization, a sampling rate, bits per sample, a sampling bit, a tap delay, a tap coefficient and a coefficient length.

17. The filter of claim 11, wherein the combination of filter parameter values achieves a desired efficiency.

18. The filter of claim 11, wherein the reconfigurable filter pool comprises a pool of reconfigurable digital signal processors.

19. For use in a multi-input, multi-output (MIMO) system, a transmitter, comprising:
a waveform detector to detect a first power level of a first transmitted MIMO stream and a second power level of a second transmitted MIMO stream on a symbol-by-symbol basis;
a processor to select a combination of filter parameter values according to the first power level and the second power level; and
a reconfigurable filter pool to filter the first transmitted MIMO stream and the second transmitted MIMO stream according to the combination of filter parameters.

20. The filter of claim 19, wherein the combination of filter parameter values minimizes at least one of: an inter-symbol interference, a power consumption of the reconfigurable filter pool and a number of instructions performed by the reconfigurable filter pool.

21. The filter of claim 19, wherein the processor selects the combination of filter parameter values using a lookup table.

22. The filter of claim 19, wherein the filter parameter values are at least one of: a number of taps, a filter length, a word length, a coefficient quantization, a sampling rate, bits per sample, a sampling bit, a tap delay, a tap coefficient and a coefficient length.

23. The filter of claim 19, wherein the combination of filter parameter values achieves a desired efficiency.

24. The filter of claim 19, wherein the reconfigurable filter pool comprises a pool of reconfigurable digital signal processors.

* * * * *